United States Patent
Hayashi et al.

(10) Patent No.: US 6,800,330 B2
(45) Date of Patent: Oct. 5, 2004

(54) COMPOSITION FOR FILM FORMATION, METHOD OF FILM FORMATION, AND SILICA-BASED FILM

(75) Inventors: Eiji Hayashi, Ibaraki (JP); Michinori Nishikawa, Ibaraki (JP); Atsushi Shiota, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 240 days.

(21) Appl. No.: 10/103,996

(22) Filed: Mar. 25, 2002

(65) Prior Publication Data

US 2002/0189495 A1 Dec. 19, 2002

(30) Foreign Application Priority Data

Mar. 26, 2001 (JP) ........................................ 2001-086895

(51) Int. Cl.⁷ ................................................. B05D 5/12
(52) U.S. Cl. .......................... 427/387; 528/39; 528/21; 528/12; 525/479; 524/588
(58) Field of Search ........................... 427/387; 528/39, 528/21, 12; 525/479; 524/588

(56) References Cited

U.S. PATENT DOCUMENTS

| | | |
|---|---|---|
| 6,410,150 B1 | 6/2002 | Kurosawa et al. |
| 6,410,151 B1 | 6/2002 | Kurosawa et al. |
| 6,413,647 B1 | 7/2002 | Hayashi et al. |
| 6,472,079 B2 | 10/2002 | Hayashi et al. |
| 6,495,264 B2 | 12/2002 | Hayashi et al. |
| 6,558,747 B2 | 5/2003 | Nakata et al. |
| 6,642,352 B2 * | 11/2003 | Suzuki et al. ............... 210/767 |

FOREIGN PATENT DOCUMENTS

| EP | 0 844 283 | 5/1998 |
|---|---|---|
| EP | 0 921 561 | 6/1999 |
| EP | 0 997 497 | 5/2000 |

* cited by examiner

Primary Examiner—Kuo-Liang Peng
(74) Attorney, Agent, or Firm—Oblon, Spivak, McClelland, Maier & Neustadt, P.C.

(57) ABSTRACT

A composition for film formation capable of forming a silica-based coating film having low water absorption and dielectric constant of 2.1 or lower and useful as an interlayer insulating film material in semiconductor devices, etc. The composition contains: (A) a product of hydrolysis and condensation obtained by hydrolyzing and condensing at least one silane compound selected from the group consisting of compounds represented by formula (1), compounds represented by formula (2), and compounds represented by formula (3) in the presence of a basic catalyst and water, $$R_a Si(OR^1)_{4-a} \qquad (1)$$

wherein R represents a hydrogen atom, a fluorine atom, or a monovalent organic group, $R^1$ represents a monovalent organic group, and a is an integer of 1 or 2, $$Si(OR^2)_4 \qquad (2)$$

wherein $R^2$ represents a monovalent organic group, $$R^3{}_b(R^4O)_{3-b}Si\text{---}(R^7)_d\text{---}Si(OR^5)_{3-c}R^6{}_c \qquad (3)$$

wherein $R^3$ to $R^6$ may be the same or different and each represents a monovalent organic group, b and c may be the same or different and each is a number of 0 to 2, $R^7$ represents an oxygen atom, a phenylene group, or a group represented by ---$(CH_2)_n$---, wherein n is an integer of 1 to 6, and d is 0 or 1; (B) a compound compatible with or dispersible in ingredient (A) and having a boiling point or decomposition temperature of from 250 to 450° C.; and (C) an organic solvent.

20 Claims, No Drawings

COMPOSITION FOR FILM FORMATION, METHOD OF FILM FORMATION, AND SILICA-BASED FILM

FIELD OF THE INVENTION

The present invention relates to a composition for film formation. More particularly, the invention relates to a composition for film formation which is capable of forming a silica-based coating film having low water absorption and dielectric constant of 2.1 or lower and useful as an interlayer insulating film material in semiconductor devices, etc.

DESCRIPTION OF THE RELATED ART

Silica ($SiO_2$) films formed by vacuum processes such as CVD have hitherto been used frequently as interlayer insulating films in semiconductor devices and other devices. In recent years, an insulating coating film which comprises a tetraalkoxysilane hydrolyzate as the main component and is called an SOG (spin on glass) film has come to be used for the purpose of forming a more even interlayer insulating film. Furthermore, as a result of the trend toward higher degree of integration in semiconductor devices and the like, an interlayer insulating film called an organic SOG film has been developed which comprises a polyorganosiloxane as the main component and has low dielectric constant.

In particular, with further progress in the degree of integration or multilayer constitution in semiconductor devices and the like, better electrical insulation between conductors has come to be required and, hence, an interlayer insulating film material having lower dielectric constant and lower water absorption has come to be desired.

Proposed as materials attaining low dielectric constant are a composition comprising a mixture of fine particles obtained by condensing an alkoxysilane in the presence of ammonia and a basic product of partial hydrolysis of an alkoxysilane (see Japanese Patent Laid-Open Nos. 263045/1993 and 315319/1993) and a coating fluid obtained by condensing a basic hydrolyzate of a polyalkoxysilane in the presence of ammonia (see Japanese Patent Laid-Open Nos. 340219/1999 and 340220/1999). However, the materials obtained by these methods have considerable unevenness in film properties such as low water absorption and dielectric constant of 2.1 or lower because of the unstable properties of the reaction products. Consequently, these materials are unsuitable for industrial production.

SUMMARY OF THE INVENTION

One object of the invention is to provide a composition for film formation which eliminates the problem described above. More particularly, the object is to provide a composition for film formation which is capable of giving a silica-based coating film having low water absorption and low dielectric constant of 2.1 or lower and useful as an interlayer insulating film in semiconductor devices and the like.

Another object of the invention is to provide a silica-based film obtained from the composition.

The invention provides a composition for film formation which comprises:

(A) a product of hydrolysis and condensation obtained by hydrolyzing and condensing at least one silane compound selected from the group consisting of compounds represented by the following formula (1) (hereinafter referred to also as "compounds (1)"), compounds represented by the following formula (2) (hereinafter referred to also as "compounds (2)"), and compounds represented by the following formula (3) (hereinafter referred to also as "compounds (3)") in the presence of a basic catalyst and water,

$$R_aSi(OR^1)_{4-a} \quad (1)$$

wherein R represents a hydrogen atom, a fluorine atom, or a monovalent organic group; $R^1$ represents a monovalent organic group; and a is an integer of 1 or 2,

$$Si(OR^2)_4 \quad (2)$$

wherein $R^2$ represents a monovalent organic group,

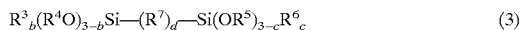

$$R^3{}_b(R^4O)_{3-b}Si-(R^7)_d-Si(OR^5)_{3-c}R^6{}_c \quad (3)$$

wherein $R^3$ to $R^6$ may be the same or different and each represents a monovalent organic group; b and c may be the same or different and each is a number of 0 to 2; $R^7$ represents an oxygen atom, a phenylene group, or a group represented by $-(CH_2)_n-$, wherein n is an integer of 1 to 6; and d is 0 or 1;

(B) a compound which is compatible with or dispersible in ingredient (A) and has a boiling point or decomposition temperature of from 250 to 450° C.; and (C) an organic solvent.

The invention further provides a method of film formation which comprises applying the composition for film formation described above to a substrate and then heating the resulting coating.

The invention furthermore provides a silica-based film obtained by the method of film formation described above.

DETAILED DESCRIPTION OF THE INVENTION

The product of hydrolysis and condensation (A) in the invention means a mixture of a hydrolyzate of at least one member selected from the group consisting of the compounds (1) to (3) and a condensate of the hydrolyzate, or means either of the hydrolyzate and the condensate.

In the hydrolyzate in ingredient (A), all the $R^1O-$, $R^2O-$, $R^4O-$, and $R^5O-$ groups contained in compounds (1) to (3) to constitute ingredient (A) need not have been hydrolyzed. For example, the hydrolyzate may be one in which only one of those groups has been hydrolyzed or two or more thereof have been hydrolyzed or may be a mixture of these.

The condensate in ingredient (A) means a product formed from the hydrolyzate of compounds (1) to (3) to constitute ingredient (A) by condensing silanol groups of the hydrolyzate to form Si—O—Si bonds. In the invention, however, all the silanol groups need not have undergone condensation. Namely, the term "condensate" as used herein means a concept which includes, for example, a condensate in which a slight proportion of the silanol groups have been condensed and a mixture of condensates which differ in the degree of condensation.

Product of Hydrolysis and Condensation (A)

The product of hydrolysis and condensation (A) is obtained by hydrolyzing and condensing, in the presence of a specific basic compound, at least one silane compound selected from the group consisting of compounds (1) to (3).

Compounds (1)

Examples of the monovalent organic groups represented by R and $R^1$ in formula (1) include alkyl, aryl, allyl, and glycidyl groups. In formula (1), R is preferably a monovalent organic group, more preferably an alkyl or phenyl group.

The alkyl group preferably has 1 to 5 carbon atoms, and examples thereof include methyl, ethyl, propyl, and butyl. These alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Specific examples of the compounds represented by formula (1) include:

trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane;

methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Preferred examples of the compounds (1) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or in combination of two or more thereof.

Compounds (2)

Examples of the monovalent organic group represented by $R^2$ in formula (2) include the same monovalent organic groups as those enumerated above with regard to formula (1).

Examples of the compounds represented by formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3)

Examples of the monovalent organic groups represented by $R^3$ to $R^6$ in formula (3) include the same monovalent organic groups as those enumerated above with regard to formula (1).

Examples of the compounds represented by formula (3) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane.

Preferred of those compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compounds represented by formula (3) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (3) wherein $R^7$ is a group represented by —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethysilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl) ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis (tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, and 1,4-bis(tri-t-butoxysilyl)benzene.

Preferred of those compounds are bis(trimethoxysilyl)methane, bis(triethoxysilyl)methane, 1,2-bis (trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

In the invention, the compounds (1), (2), and (3) described above may be used alone or in combination of two or more thereof to constitute ingredient (A).

When at least one silane compound selected from the group consisting of the compounds (1) to (3) is hydrolyzed and condensed, water is used preferably in an amount of from more than 20 mol to 150 mol, more preferably from more than 20 mol to 130 mol, per mol of the at least one compound selected from the compounds (1) to (3). In case where water is added in an amount of 20 mol or smaller, the resulting composition may give a coating film having poor cracking resistance. On the other hand, addition of water in an amount exceeding 150 mol may result in polymer precipitation or gelation during the hydrolysis and condensation reactions.

The addition of at least one silane compound selected from the compounds (1) to (3) to the reaction mixture may be conducted en bloc, or may be conducted continuously or intermittently. When the at least one silane compound is added continuously or intermittently, the period of addition is preferably from 5 minutes to 12 hours, more preferably from 10 minutes to 6 hours.

The production of the product of hydrolysis and condensation (A) for use in the invention is characterized in that a basic catalyst is used in hydrolyzing and condensing at least one silane compound selected from the group consisting of the compounds (1) to (3).

By the use of a basic catalyst, a silica-based film having low dielectric constant can be obtained. Examples of basic catalysts usable in the invention include amine compounds such as pyridine, pyrrole, piperazine, pyrrolidine, piperidine, picoline, monoethanolamine, diethanolamine, dimethylmonoethanolamine, monomethyldiethanolamine, triethanolamine, diazobicyclooctane, diazabicyclononane, diazabicycloundecene, tetramethylammonium hydroxide, tetraethylammonium hydroxide, tetrapropylammonium hydroxide, tetrabutylammoniumhydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimizin, 1-amino-3-methylbutane, dimethylglycine, and 3-amino-3-methylamine; and inorganic hydroxides such as sodium hydroxide, potassium hydroxide, and lithium hydroxide.

Preferred examples among those include ammonia, the alkylamines, the tetraalkylammonium hydroxides, sodium hydroxide, and potassium hydroxide. Especially preferred are the alkylamines and the tetraalkylammonium hydroxides.

Those basic catalysts may be used alone or in combination of two or more thereof.

The amount of the basic catalyst to be used is generally from 0.00001 to 10 mol, preferably from 0.00005 to 5 mol, more preferably from 0.001 to 1 mol, most preferably from 0.01 to 0.5 mol, per mol of the total amount of the $R^1O$—, $R^2O$—, $R^4O$—, and $R^5O$— groups contained in the compounds (1) to (3). As long as the specific basic compound is used in an amount within that range, polymer precipitation or gelation is less apt to occur during the reaction.

The radius of gyration of the product of hydrolysis and condensation (A) thus obtained is preferably from 5 to 50 nm, more preferably from 8 to 40 nm, most preferably from 9 to 20 nm, in terms of radius of gyration determined by the GPC (refractive index, viscosity, or light scattering) method. When the product of hydrolysis and condensation has a radius of gyration of from 5 to 50 nm, the composition can give a silica-based film excellent especially in dielectric constant and mechanical strength.

The product of hydrolysis and condensation (A) thus obtained is characterized by being not particulate and hence having excellent applicability to substrates. The fact that the product of hydrolysis and condensation (A) is not particulate can be ascertained through examination with, e.g., a transmission electron microscope (TEM).

In ingredient (A), the proportion of the product of hydrolysis and condensation derived from each compound is as follows, in terms of the product of complete hydrolysis and condensation. The content of the product of hydrolysis and condensation derived from the compound (2) is generally from 5 to 75% by weight, preferably from 10 to 70% by weight, more preferably from 15 to 70% by weight, based on the sum of all the products of hydrolysis and condensation derived from the compounds (1) to (3). The content of the product of hydrolysis and condensation derived from the compound (1) and compound (3) or from either is generally from 95 to 25% by weight, preferably from 90 to 30% by weight, more preferably from 85 to 30% by weight, based on the sum of all the products of hydrolysis and condensation derived from the compounds (1) to (3). When the content of the product of hydrolysis and condensation derived from the compound (2) is from 5 to 75% by weight based on the sum of all the products of hydrolysis and condensation derived from the compounds (1) to (3), then the coating film obtained has a high modulus of elasticity and an exceedingly low dielectric constant.

The term "product of complete hydrolysis and condensation" as used herein means a product in which all the $R^1O$—, $R^2O$—, $R^4O$—, and $R^5O$— groups contained in the compound (1), (2), or (3) have been hydrolyzed into SiOH groups and then completely condensed to form siloxane structures.

Ingredient (A) is preferably a product of the hydrolysis and condensation of both at least one of the compounds (1) and at least one of the compounds (2), because this ingredient (A) imparts better storage stability to the composition to be obtained.

In producing a product of hydrolysis and condensation (A), at least one silane compound selected from the group consisting of compounds (1) to (3) is hydrolyzed and condensed in the presence of a specific basic compound so that the resulting product of hydrolysis and condensation preferably has a radius of gyration of from 5 to 50 nm. It is preferred to adjust the pH of the resulting composition to 7 or lower.

Examples of techniques for pH adjustment include:
(1) to add a pH regulator;
(2) to distill off the specific basic compound from the composition at ordinary or reduced pressure;
(3) to bubble a gas such as nitrogen or argon into the composition to thereby remove the specific basic compound from the composition;

(4) to remove the specific basic compound from the composition with an ion-exchange resin; and (5) to remove the specific basic compound from the system by extraction or washing.

Those techniques may be used alone or in combination of two or more thereof.

Examples of the pH regulator include inorganic acids and organic acids.

Examples of the inorganic acids include hydrochloric acid, nitric acid, sulfuric acid, hydrofluoric acid, phosphoric acid, boric acid, and oxalic acid.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaricacid, citricacid, tartaricacid, succinicacid, itaconic acid, mesaconic acid, citraconic acid, malic acid, a glutaric acid hydrolyzate, a maleic anhydride hydrolyzate, and a phthalic anhydride hydrolyzate.

Those compounds may be used alone or in combination of two or more thereof.

Such a pH regulator is used to adjust the pH of the composition to 7 or lower, preferably 1 to 6. The method described above which comprises regulating the radius of gyration of the product of hydrolysis and condensation to from 5 to 50 nm and then adjusting the pH thereof with the pH regulator to a value within that range produces the effect that the composition obtained has improved storage stability.

The pH regulator is used in an amount suitably selected so that the pH of the composition becomes a value within that range.

In synthesizing the hydrolyzate polymer for use in the invention, at least one member selected from the group consisting of alcohol solvents, ketone solvents, amide solvents, ester solvents, and aprotic solvents can be used as a reaction solvent.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol;

polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents maybe used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methyl-$\Delta^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

The reaction temperature in synthesizing the polymer for use in the invention is generally from 0 to 100° C., preferably from 15 to 90° C.

Ingredient (B)

Examples of the compound which is compatible with or dispersible in ingredient (A) and has a boiling point or decomposition temperature of from 250 to 450° C. for use in the invention include (1) a compound having a poly(alkylene oxide) structure, (2) a (meth)acrylatepolymer, (3) a vinylamidepolymer, (4) an aromatic vinyl polymer, (5) a dendrimer, (6) a combination of an oleophilic compound and a dispersant, (7) ultrafine particles, and (8) a compound having a sugar chain structure.

In the invention, the boiling point or decomposition temperature means that as measured at 1 atm.

(1) Compound Having Poly(Alkylene Oxide) Structure

Examples of the poly(alkylene oxide) structure include a poly(ethylene oxide) structure, poly(propylene oxide) structure, poly(tetramethylene oxide) structure, and poly(butylene oxide) structure.

Specific examples of the compound include ether type compounds such as polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and sucrose fatty acid esters.

Preferred as ingredient (B) are polyoxyalkylene block copolymers such as polyoxyethylene/polyoxypropylene block copolymers.

Examples of the polyoxyethylene/polyoxypropylene block copolymers include compounds having either of the following block structures:

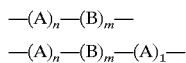

wherein A represents —CH$_2$CH$_2$O—; B represents —CH$_2$CH(CH$_3$)O—; n is a number of 1 to 90; m is a number of 10 to 99; and 1 is a number of 0 to 90.

(2) (Meth)Acrylate Polymer

Examples of acrylic and methacrylic esters constituting acrylic polymers usable in the invention include alkyl acrylates, alkyl methacrylates, alkoxyalkyl acrylates, and alkoxyalkyl methacrylates.

Examples of the alkyl acrylates include ones in which the alkyl has 1 to 6 carbon atoms, such as methyl acrylate, ethyl acrylate, n-propyl acrylate, isopropyl acrylate, n-butyl acrylate, isobutyl acrylate, pentyl acrylate, and hexyl acrylate. Examples of the alkyl methacrylates include ones in which the alkyl has 1 to 6 carbon atoms, such as methyl methacrylate, ethyl methacrylate, n-propyl methacrylate, isopropyl methacrylate, n-butyl methacrylate, isobutyl methacrylate, butyl methacrylate, pentyl methacrylate, and hexyl methacrylate. Examples of the alkoxyalkyl acrylates include methoxymethyl acrylate and ethoxyethyl acrylate. Examples of the alkoxyalkyl methacrylates include methoxymethyl methacrylate and ethoxyethyl methacrylate.

Preferred of those are the alkyl methacrylates. It is especially preferred to use ethyl methacrylate, isobutyl methacrylate, or the like.

The acrylic polymer for use in the invention is preferably one formed by copolymerizing one or more of those monomers with a monomer having an alkoxysilyl group.

Examples of the monomer having an alkoxysilyl group include 3-(trimethoxysilyl)propyl methacrylate, 3-(triethoxysilyl)propyl methacrylate, 3-[tri(methoxyethoxy)silyl]propyl methacrylate, 3-(methyldimethoxysilyl)propyl methacrylate, and 3-(methyldiethoxysilyl)propyl methacrylate.

In such an acrylic polymer, the amount of the units derived from the monomer having an alkoxysilyl group is generally from 0.5 to 10% by mole, preferably from 1 to 7% by mole, based on all monomer units constituting the acrylic polymer.

The acrylic polymer to be used in the invention may contain up to 40% by mole comonomer units derived from one or more radical-polymerizable monomers other than the acrylic esters, methacrylic esters, and alkoxysilyl-containing monomers.

Examples of the radical-polymerizable monomers include unsaturated carboxylic acids such as acrylic acid and methacrylic acid, unsaturated amides such as N,N-dimethylacrylamide and N,N-dimethylmethacrylamide, unsaturated nitrites such as acrylonitrile, unsaturated ketones such as methyl vinyl ketone, and aromatic compounds such as styrene and α-methylstyrene.

In the invention, the acrylic polymer has a number average molecular weight calculated for standard polystyrene of generally from 1,000 to 100,000, preferably from 1,000 to 20,000.

(3) Vinylamide Polymer

Examples of the vinylamide polymer include poly(N-vinylacetamide), poly(N-vinylpyrrolidone), poly(2-methyl-2-oxazoline), and poly(N,N-dimethylacrylamide).

(4) Aromatic Vinyl Polymer

Examples of the aromatic vinyl polymer include polystyrene, polymethylstyrene, and poly-a-methylstyrene.

(5) Dendrimer

Examples of the dendrimer include benzyl ether dendrimers, phenylacetylene dendrimers, polyamine dendrimers, and polyamide dendrimers. However, polyamine dendrimers are preferred from the standpoint of thermal decomposability.

(6) Combination of Oleophilic Compound and Dispersant

An oleophilic compound, when used alone, is not compatible with ingredient (A) in a wide range of proportions. However, when used in the presence of a dispersant, an oleophilic compound is compatible with ingredient (A) in a wide range of proportions. The two ingredients are hence used in combination. Examples of the oleophilic compound include polycarboxylic acid esters such as didecyl phthalate, diundecyl phthalate, didodecyl phthalate, ditridecyl phthalate, tris(2-ethylhexyl) trimellitate, tridecyl trimellitate, tridodecyl trimellitate, tetrabutyl pyromellitate, tetrahexyl trimellitate, tetraoctyl pyromellitate, bis(2-ethylhexyl) dodecanedioate, and bisdecyl dodecanedioate. Examples of the dispersant which compatibilizes these oleophilic compounds include higher alcohols such as octanol, lauryl alcohol, decyl alcohol, and undecyl alcohol.

Such a higher alcohol as the dispersant can be used in an amount of from 0.1 to 10 times (by weight) the amount of the oleophilic compound.

(7) Ultrafine Particles

The ultrafine particles are polymer particles having a particle diameter of 100 nm or smaller which have been produced through ordinary emulsion polymerization while controlling the particle diameter by selecting or regulating emulsifier kind, emulsifier concentration, stirring rate, etc. The particles may be produced from one or more monomers comprising an aromatic vinyl compound and a (meth) acrylate compound using a crosslinking monomer for particle diameter regulation.

(8) Compound Having Sugar Chain Structure

Examples of the compound having a sugar chain structure include cyclodextrins, sucrose esters, oligosaccharides, glucose, fructose, mannitol, starch sugars, D-sorbitol, dextran, zanthan gum, curdlan, pullulan, cycloamylose, isomerized sugars, maltitol, cellulose acetate, cellulose, carboxymethyl cellulose, hydroxyethyl cellulose, hydroxypropyl cellulose, methyl cellulose, ethyl hydroxyethyl cellulose, carboxymethyl cellulose, chitin, and chitosan.

In the invention, it is preferred to use as ingredient (B) the compound having an alkylene oxide structure (1) or the acrylate polymer (2). It is more preferred to use the compound having an alkylene oxide structure (1).

The amount of ingredient (B) to be used is generally from 50 to 250 parts by weight, preferably from 50 to 200 parts by weight, more preferably from 50 to 150 parts by weight, per 100 parts by weight of ingredient (A) (in terms of the product of complete hydrolysis and condensation). When the proportion of ingredient (B) is lower than 50 parts by weight, there are cases where a coating film having dielectric constant of 2.1 or lower is not obtained. On the other hand, proportions thereof exceeding 250 parts by weight result in impaired applicability in coating film formation.

Organic Solvent (C)

Examples of the solvent used in the invention include the same organic solvents as those usable for the polymerization for producing ingredient (A). Preferred of these are solvents represented by the following formula (4):

$$R^8O(R^{10}O)_eR^9 \quad (4)$$

wherein $R^8$ and $R^9$ each independently represents a hydrogen atom or a monovalent organic group selected from the group consisting of alkyl groups having 1 to 4 carbon atoms and $CH_3CO-$; $R^{10}$ represents an alkylene group; and e is an integer of 1 or 2.

Specific examples of the organic solvent include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, ethylene glycol dibutyl ether, ethylene glycol monomethyl ether acetate, ethylene glycol monoethyl ether acetate, ethylene glycol monopropyl ether acetate, ethylene glycol monobutyl ether acetate, propylene glycol monomethyl ether, propyl glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, dipropylene glycol monomethyl ether acetate, dipropylene glycol monoethyl ether acetate, dipropylene glycol monopropyl ether acetate, and dipropylene glycol monoethyl ether acetate. Especially preferred are the propylene glycol monoalkyl ethers and the propylene glycol monoalkyl ether acetates.

Those solvents may be used alone or in combination of two or more thereof.

Other Additives

Ingredients such as colloidal silica, colloidal alumina, surfactants, silane coupling agents, radical generators, and triazene compounds may be added to the composition for film formation obtained in the invention.

The colloidal silica is a dispersion comprising, for example, any of the aforementioned hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd. and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the surfactants include nonionic surfactants, anionic surfactants, cationic surfactants, and amphoteric surfactants, and further include fluorochemical surfactants, silicone surfactants, poly(alkylene oxide) surfactants, and poly(meth)acrylate surfactants. Preferred of these are fluorochemical surfactants and silicone surfactants.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di(1,1,2,2-tetrafluorobutyl)ether, hexaethylene glycol 1,1,2,2,3,3-hexafluoropentyl ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-perfluorooctanesulfonamido)propyl]-N,N'-dimethyl-N-carboxymethyleneammonium betaine, perfluoroalkylsulfonamidopropyltrimethylammonium salts, perfluoroalkyl-N-ethylsulfonyl glycine salts, bis(N-perfluorooctylsulfonyl-N-ethylaminoethyl) phosphate, and monoperfluoroalkylethyl phosphates.

Commercially available products of such fluorochemical surfactants include products available under the trade names of Megafac F142D, F172, F173, and F183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710 and Surflon S-382, SC-101, SC-102, SC-103, SC-104, SC-105, and SC-106 (manufactured by Asahi Glass Co., Ltd.); BM-1000 and BM-1100 (manufactured by Yusho K.K.); and NBX-15 (manufactured by NEOS Co., Ltd.). Especially preferred of these are Megafac F172, BM-1000, BM-1100, and NBX-15.

Examples of the silicone surfactants include SH7PA, SH21PA, SH30PA, and ST94PA (all manufactured by Dow Corning Toray Silicone Co., Ltd.). Especially preferred of these are SH28PA and SH30PA.

The amount of such a surfactant to be used is usually from 0.0001 to 10 parts by weight per 100 parts by weight of ingredient (A) (in terms of the product of complete hydrolysis and condensation).

Those surfactants may be used alone or in combination of two or more thereof.

Examples of the silane coupling agents include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane.

Those silane coupling agents may be used alone or in combination of two or more thereof.

Examples of the radical generators include isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexylperoxydicarbonate, t-hexylperoxyneodecanoate, dimethoxybutyl peroxydicarbonate, di(3-methyl-3-methoxybutyl) peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy)hexane, t-butyl peroxyacetate, 2,2-bis(t-butylperoxy)butane, t-butyl peroxybenzoate, n-butyl 4,4-bis(t-butylperoxy)valerate, di-t-butyl peroxyisophthalate, α,α'-bis(t-butylperoxy)diisopropylbenzene, dicumyl peroxide, 2,5-dimethyl-2,5-di(t-butylperoxy)hexane, t-butyl cumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane.

The amount of such a radial generator to be added is preferably from 0.1 to 10 parts by weight per 100 parts by weight of the polymer.

Those radical generators may be used alone or in combination of two or more thereof.

Examples of the triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis (3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]fluorene.

Those triazene compounds may be used alone or in combination of two or more thereof.

The composition of the invention thus obtained has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

The total solid concentration of the composition is regulated, according to need, by means of concentration or dilution with an organic solvent.

For applying the composition of the invention to a substrate such as a silicon wafer, $SiO_2$ wafer, SiN wafer, SiC wafer, SiCO wafer, SiCN wafer or SiOCN water, use may be made of a coating technique such as spin coating, dip coating, roll coating, or spraying.

This coating operation can be conducted so as to form a coating film having a thickness on a dry basis of about from 0.02 to 2.5 μm in the case of single coating or about from 0.04 to 5.0 μm in the case of double coating. Thereafter, the wet coating film may be dried at ordinary temperature or dried with heating at a temperature of about from 80 to 600° C. usually for about from 5 to 240 minutes. Thus, a vitreous or macromolecular insulating film can be formed.

In this operation, heating can be conducted with a hot plate, oven, furnace, or the like, for example, in the air, in a nitrogen or argon atmosphere, under vacuum, or under reduced pressure having a controlled oxygen concentration. Irradiation with electron beams or ultraviolet also can be used for forming a coating film.

In order to control the curing rate of the coating film, stepwise heating or a suitably selected atmosphere, such as a nitrogen, air, oxygen, or reduced-pressure atmosphere, can be used according to need.

The silica-based film of the invention thus obtained has a density of generally from 0.35 to 1.2 g/cm$^3$, preferably from 0.4 to 1.1 g/cm$^3$, more preferably from 0.5 to 1.0 g/cm$^3$. In case where the density of the film is lower than 0.35 g/cm$^3$, the coating film has impaired mechanical strength. On the other hand, in case where the density thereof exceeds 1.2 g/cm$^3$, low dielectric constant cannot be obtained.

When the silica-based film of the invention is examined for pore size distribution by the BJH method, no pores of 10 nm or larger are observed therein. The film is hence suitable for use as an interlayer insulating film material for insulation between fine wirings.

Furthermore, the silica-based film of the invention is characterized by having low water absorption. For example, when the coating film is allowed to stand in an atmosphere of 127° C., 2.5 atm, and 100% RH for 1 hour, then no water adsorption to the coating film is observed by IR spectroscopy.

This water absorption can be regulated by controlling the amount of a tetraalkoxysilane used in the invention as a compound (1) in preparing the composition for film formation.

The silica-based film of the invention has a dielectric constant of generally from 2.1 to 1.2, preferably from 2.1 to 1.5, more preferably from 2.1 to 1.6.

The interlayer insulating film thus obtained has low coefficient of moisture absorption and has dielectric constant of 2.1 or lower. Consequently, the composition of the invention is useful in applications such as interlayer insulating films or etching stopper films for semiconductor devices such as LSIs, system LSIs, DRAMs, SDRAMs, RDRAMs, and D-RDRAMs, protective films such as surface coat films for semiconductor devices, interlayers for use in semiconductor production processes employing a multilayered resist, interlayer insulating films for multilayered printed circuit boards, and protective or insulating films for liquid crystal display devices.

The invention will be explained below in more detail by reference to the following Examples. However, the following description merely shows general embodiment examples of the invention, and it should be understood that the invention is not construed as being limited by the description without particular reasons.

In the following Examples and Comparative Examples, all "parts" and "percents" are by weight unless otherwise indicated.

Various properties were evaluated by the following methods.

Radius of Gyration

Measured by gel permeation chromatography (GPC) (refractive index, viscosity, or light scattering measurement) under the following conditions.

Sample Solution: A product of the hydrolysis and condensation of silane compounds was diluted with methanol containing 10 mM LiBr to a solid concentration of 0.25% to prepare a sample solution for GPC (refractive index, viscosity, or light scattering measurement).

Apparatus:
GPC system: Model GPC-8020, manufactured by Tosoh Corp.
Column: Alpha 5000/3000, manufactured by Tosoh Corp.
Viscosity detector and light scattering detector: Model T-60 Dual Meter, manufactured by Viscotek Corp.
Carrier solution: methanol containing 10 mM LiBr
Carrier feed rate: 1 ml/min
Column temperature: 40° C.

Dielectric Constant

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then cured in a 420° C. vertical furnace at a reduced pressure of 50 mTorr for 1 hour. On the film obtained was formed an aluminum electrode pattern by vapor deposition. Thus, a sample for dielectric constant measurement was produced. This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Coefficient of Moisture Absorption of Coating Film

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then cured in a 420° C. vertical furnace at a reduced pressure of 50 mTorr for 1 hour. The coated substrate obtained was allowed to stand in an atmosphere of 127° C., 2.5 atm, and 100% RH for 1 hour and then heated on a hot plate at 100° C. for 5 minutes. This substrate was evaluated for moisture absorption with a TDS apparatus (Type EMD-WA100S, manufactured by Denshi Kagaku).

Evaluation conditions are as follows. The sample was heated from room temperature to 600° C. at a heating rate of 1° C./sec to obtain a TDS spectrum, and the area of water fragments (M/Z=18) for the temperature range of from room temperature to 400° C. was determined and calculated for a film thickness of 500 nm. An SiO$_2$ film formed by CVD on an 8-inch silicon wafer was analyzed in the same manner to determine the area of water fragments (M/Z=18). Based on the a real ratio between the two (composition/CVD SiO$_2$), the moisture absorption of the sample coating film was evaluated.

◯: Moisture absorption of the coating film was equal to or lower than that of the CVD SiO$_2$.

X: Moisture absorption of the coating film was higher than that of the CVD SiO$_2$.

SYNTHESIS EXAMPLE 1

Into a separable flask made of quartz, 470.9 g of distilled ethanol, 226.5 g of ion-exchanged water, and 17.2 g of 25% aqueous tetramethylammonium hydroxide solution were introduced. The contents were stirred and homogenized. To this solution, a mixture of 44.9 g of methyltrimethoxysilane and 68.6 g of tetraethoxysilane was added. The resulting solution was reacted for 2 hours while being kept at 55° C. To this solution, 50 g of 20% aqueous nitric acid solution was added. This mixture was sufficiently stirred and then cooled to room temperature. To this solution, 400 g of propylene glycol monopropyl ether was added. Subsequently, the resulting solution was concentrated with a 50° C. evaporator until the concentration thereof reached 10% (in terms of the content of the product of complete hydrolysis and condensation). Thereafter, 10 g of a 10% maleic acid solution in propylene glycol monopropyl ether was added to the concentrated solution. Thus, a reaction mixture (1) was obtained.

The product of condensation and other reactions thus obtained had a radius of gyration of 20.9 nm.

SYNTHESIS EXAMPLE 2

Into a separable flask made of quartz, 470.9 g of distilled ethanol, 226.5 g of ion-exchanged water, and 17.2 g of 25% aqueous tetramethylammonium hydroxide solution were introduced. The contents were stirred and homogenized. To this solution, a mixture of 44.9 g of methyltrimethoxysilane and 68.6 g of tetraethoxysilane was added over 2 hours. The resulting solution was reacted for 5 hours while being kept at 59° C. To this solution, 50 g of 20% aqueous nitric acid solution was added. This mixture was sufficiently stirred and then cooled to room temperature. To this solution, 400 g of propylene glycol monopropyl ether was added. Subsequently, the resulting solution was concentrated with a 50° C. evaporator until the concentration thereof reached 10% (in terms of the content of the product of complete hydrolysis and condensation). Thereafter, 10 g of a 10% maleic acid solution in propylene glycol monopropyl ether was added to the concentrated solution. Thus, a reaction mixture (2) was obtained.

The product of condensation and other reactions thus obtained had a radius of gyration of 17.9 nm.

SYNTHESIS EXAMPLE 3

Into a separable flask made of quartz, 470.9 g of distilled ethanol, 233.3 g of ion-exchanged water, and 10.4 g of 25% aqueous potassium hydroxide solution were introduced. The contents were stirred and homogenized. To this solution, a mixture of 44.9 g of methyltrimethoxysilane and 68.6 g of tetraethoxysilane was added. The resulting solution was reacted for 2 hours while being kept at 52° C. To this solution, 50 g of 20% aqueous nitric acid solution was added. This mixture was sufficiently stirred and then cooled to room temperature. To this solution, 400 g of propylene glycol monopropyl ether was added. Subsequently, the resulting solution was concentrated with a 50° C. evaporator until the concentration thereof reached 10% (in terms of the content of the product of complete hydrolysis and condensation). Thereafter, 10 g of a 10% maleic acid solution in propylene glycol monopropyl ether was added to the concentrated solution. Thus, a reaction mixture (3) was obtained.

The product of condensation and other reactions thus obtained had a radius of gyration of 24.6 nm.

SYNTHESIS EXAMPLE 4

Into a separable flask made of quartz, 470.9 g of distilled ethanol, 226.5 g of ion-exchanged water, and 17.2 g of 25% aqueous tetramethylammonium hydroxide solution were introduced. The contents were stirred and homogenized. To this solution, a mixture of 44.9 g of methyltrimethoxysilane and 68.6 g of tetraethoxysilane was added. The resulting solution was reacted for 2 hours while being kept at 55° C. To this solution, 50 g of 20% aqueous nitric acid solution was added. This mixture was sufficiently stirred and then cooled to room temperature. To this solution, 400 g of propylene glycol monoethyl ether was added. Subsequently, the resulting solution was concentrated with a 50° C. evaporator until the concentration thereof reached 10% (in terms of the content of the product of complete hydrolysis and condensation). Thereafter, 10 g of a 10% maleic acid solution in propylene glycol monoethyl ether was added to the concentrated solution. Thus, a reaction mixture (4) was obtained.

The product of condensation and other reactions thus obtained had a radius of gyration of 19.9 nm.

Comparative Synthesis Example 1

Into a separable flask made of quartz, 154.24 g of methyltrimethoxysilane, 288.83 g of tetramethoxysilane, and 250 g of distilled propylene glycol monoethyl ether were introduced. The silane compounds were dissolved in the solvent. To this solution, 297 g of ion-exchanged water containing 10 g of maleic acid dissolved therein was added dropwise over 1 hour. This solution was reacted at 50° C. for 3 hours, and 400 g of propylene glycol monopropyl ether was then added thereto. The resulting solution was concentrated with a 50° C. evaporator until the concentration thereof reached 20% (in terms of the content of the product of complete hydrolysis and condensation). Thereafter, 10 g of a 10% maleic acid solution in propylene glycol monopropyl ether was added to the concentrated solution. Thus, a reaction mixture (5) was obtained.

The product of condensation and other reactions thus obtained had a radius of gyration of 0.2 nm.

Example 1

To the reaction mixture (1) obtained in Synthesis Example 1, 120 parts of polyethylene glycol having a weight average molecular weight of 2,000 per 100 parts of ingredient (A) in the mixture (1) were added. This solution was filtered through a Teflon filter having an opening diameter of 0.2 $\mu$m to obtain a composition for film formation of the invention.

The composition obtained was applied to a silicon wafer by spin coating.

The coating film thus formed had dielectric constant as extremely low as 2.01 and had a coefficient of moisture absorption not higher than that of the CVD $SiO_2$.

Examples 2 to 8

Compositions for film formation were prepared according to the makeups shown in Table 1, and were evaluated in the same manner as in Example 1. The results of evaluation obtained are shown in Table 1.

TABLE 1

| Example | Ingredient (A) | Ingredient (B) [amount per 100 parts of ingredient (A)] | Dielectric constant | Coefficient of moisture absorption |
|---|---|---|---|---|
| 1 | Reaction mixture (1) | Polyethylene glycol having weight-average molecular weight of 2,000, 120 parts | 2.01 | ◯ |
| 2 | Reaction mixture (1) | Polyethylene glycol having weight-average molecular weight of 2,000, 150 parts | 1.80 | ◯ |
| 3 | Reaction mixture (2) | PE-61*, 55 parts | 2.19 | ◯ |
| 4 | Reaction mixture (2) | PE-61*, 120 parts | 1.93 | ◯ |
| 5 | Reaction mixture (2) | PE-61*, 150 parts | 1.73 | ◯ |
| 6 | Reaction mixture (3) | Poly(isobutyl methacrylate) having weight-average molecular weight of 1,500, 100 parts | 1.82 | ◯ |
| 7 | Reaction mixture (3) | PE-61*, 150 parts | 1.69 | ◯ |
| 8 | Reaction mixture (4) | Poly(hexyl methacrylate) having weight-average molecular weight of 1,500, 100 parts | 2.02 | ◯ |

TABLE 1-continued

| Example | Ingredient (A) | Ingredient (B) [amount per 100 parts of ingredient (A)] | Dielectric constant | Coefficient of moisture absorption |
|---|---|---|---|---|

*PE-61: Poly(ethylene oxide) block/poly(propylene oxide) block/poly(ethylene oxide) block copolymer (Nupol PE61, manufactured by Sanyo Chemical Industries, Ltd.)

Comparative Example 1

A coating film was formed and evaluated in the same manner as in Example 1, except that the reaction mixture (4) obtained in Synthesis Example 4 only was used.

Comparative Example 2

A coating film was formed and evaluated in the same manner as in Example 1, except that polyethylene glycol having a weight-average molecular weight of 2,000 was added to the reaction mixture (5) obtained in Comparative Synthesis Example 1 in an amount of 120 parts per 100 parts of ingredient (A) in the mixture (5).

Reference Example 1

A coating film was formed and evaluated in the same manner as in Example 1, except that polyethylene glycol having a weight average molecular weight of 2,000 was added to the reaction mixture (4) obtained in Synthesis Example 4 in an amount of 40 parts per 100 parts of ingredient (A) in the mixture (4).

The coating film obtained had dielectric constant as low as 2.18. However, no coating film having target dielectric constant of 2.1 or lower could be obtained.

Reference Example 2

A coating film was formed and evaluated in the same manner as in Example 1, except that polyethylene glycol having a weight average molecular weight of 2,000 was added to the reaction mixture (4) obtained in Synthesis Example 4 in an amount of 300 parts per 100 parts of ingredient (A) in the mixture (4). However, the composition had poor applicability and many striations generated upon coating for film formation.

According to the invention, a composition for film formation (material for interlayer insulating films) which gives a coating film having low coefficient of moisture absorption and dielectric constant of 2.1 or lower can be provided by using, as components of the composition, (A) a product obtained by hydrolyzing and/or condensing one or more alkoxysilanes in the presence of a basic catalyst and water, (B) a compound compatible with or dispersible in ingredient (A) and having a boiling point or decomposition temperature of from 250 to 450° C., and (C) an organic solvent.

What is claimed is:

1. A composition for film formation which comprises:
   (A) a product of hydrolysis and condensation obtained by hydrolyzing and condensing at least one silane compound selected from the group consisting of compounds represented by the following formula (1), compounds represented by the following formula (2), and compounds represented by the following formula (3) in the presence of a basic catalyst and water, $R_aSi(OR^1)_{4-a}$ (1)

wherein R represents a hydrogen atom, a fluorine atom, or a monovalent organic group; $R^1$ represents a monovalent organic group; and a is an integer of 1 or 2, $Si(OR^2)_4$ (2)

wherein $R^2$ represents a monovalent organic group, $R^3_b(R^4O)_{3-b}Si—(R^7)_d—Si(OR^5)_{3-c}R^6_c$ (3)

wherein $R^3$ to $R^6$ may be the same or different and each represents a monovalent organic group; b and c may be the same or different and each is a number of 0 to 2; $R^7$ represents an oxygen atom, a phenylene group, or a group represented by $—(CH_2)_n—$, wherein n is an integer of 1 to 6; and d is 0 or 1;
   (B) a compound which is compatible with or dispersible in ingredient (A) and has a boiling point or decomposition temperature of from 250 to 450° C.; and
   (C) an organic solvent,
   wherein component (A) has a radius of gyration of from 5 to 50 nm.

2. The composition for film formation of claim 1, wherein the amount of ingredient (B) is from 50 to 250 parts by weight per 100 parts by weight of ingredient (A) (in terms of the product of complete hydrolysis and condensation).

3. The composition for film formation of claim 1, wherein ingredient (B) is either a compound having a poly(alkylene oxide) structure or an acrylic polymer.

4. The composition for film formation of claim 1, wherein the basic catalyst comprises at least one member selected from the group consisting of ammonia, alkylamines, tetraalkylammonium hydroxides, sodium hydroxide, and potassium hydroxide.

5. The composition for film formation of claim 1, wherein ingredient (C) comprises at least one organic solvent represented by the following formula (4):

$R^8O(R^{10}O)_eR^9$ (4)

wherein $R^8$ and $R^9$ each independently represents a hydrogen atom or a monovalent organic group selected from the group consisting of alkyl groups having 1 to 4 carbon atoms and $CH_3CO—$; $R^{10}$ represents an alkylene group; and e is an integer of 1 or 2.

6. The composition for film formation of claim 5, wherein ingredient (C) comprises at least one member selected from the group consisting of ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, dipropylene glycol monoalkyl ethers, dipropylene glycol dialkyl ethers, and dipropylene glycol monoalkyl ether acetates.

7. A method of film formation which comprises applying the composition for film formation of claim 1 to a substrate and then heating the resulting coating.

8. A silica-based film obtained by the method of film formation of claim 7.

9. The silica-based film of claim 8 which has dielectric constant of 2.1 or lower.

10. The composition for film formation of claim 1, wherein component (A) has a radius of gyration of from 8 to 40 nm.

11. The composition for film formation of claim 10, wherein component (A) has a radius of gyration of from 9 to 20 nm.

12. The composition for film formation of claim 1, wherein a silane of formula (2) is present in an amount of 5 to 75% by weight of component (A), and at least one of a compound of formula (1) and a compound of formula (3) is present in a total amount of 95 to 25% by weight of component (A).

13. The composition for film formation of claim 12, wherein a silane of formula (2) is present in an amount of 10 to 70% by weight of component (A), and at least one of a compound of formula (1) and a compound of formula (3) is present in a total amount of 90 to 30% by weight of component (A).

14. The composition for film formation of claim 13, wherein a silane of formula (2) is present in an amount of 15 to 70% by weight of component (A), and at least one of a compound of formula (1) and a compound of formula (3) is present in a total amount of 85 to 30% by weight of component (A).

15. The composition for film formation of claim 1, wherein component (B) is a polyoxyalkylene block copolymer.

16. The composition for film formation of claim 15, wherein the polyoxyalkylene block copolymer is a polyoxyethylene/polyoxypropylene block copolymer.

17. The composition of film formation of claim 1, wherein component (B) is an alkylmethacrylate.

18. The composition of film formation of claim 17, wherein the alkylmethacrylate is ethylmethacrylate, isobutylmethacrylate or hexylmethacrylate.

19. The composition of film formation of claim 1, wherein component (B) is an acrylic polymer formed by copolymerizing one or more acrylate monomers with a monomer having an alkoxysilyl group.

20. The silica-based film of claim 8, which has a moisture absorption equal to or lower than that of $SiO_2$ formed by chemical vapor deposition.

* * * * *